United States Patent [19]
Sugita et al.

[11] Patent Number: 5,679,410
[45] Date of Patent: Oct. 21, 1997

[54] CONTINUOUS FABRICATION OF THIN FILM MAGNETIC RECORDING MEDIUM WITH VACUUM DEPOSITION

[75] Inventors: Ryuji Sugita; Kiyokazu Tohma, both of Hirakata; Tatsuaki Ishida, Sakai; Kazunari Yoshimoto, Kyoto, all of Japan

[73] Assignee: Matsushita Electric Industrial Co., Ltd., Osaka-fu, Japan

[21] Appl. No.: 462,690

[22] Filed: Jun. 5, 1995

[30]     Foreign Application Priority Data

Jun. 6, 1994 [JP] Japan .................................. 6-123656
Jul. 12, 1994 [JP] Japan .................................. 6-160021

[51] Int. Cl.$^6$ .............................. C23C 14/00; C23C 14/04
[52] U.S. Cl. .......................... 427/523; 427/525; 427/529; 427/531; 427/566; 427/128; 427/585; 427/248.1; 427/251; 427/255.5; 118/718; 118/723 EB; 118/724
[58] Field of Search .......................... 427/566, 529, 427/531, 525, 585, 128, 248.1, 250, 251, 255.5, 523; 118/718, 723 EB, 724

[56]             References Cited

U.S. PATENT DOCUMENTS

| | | | |
|---|---|---|---|
| 4,601,912 | 7/1986 | Arai et al. | 427/130 |
| 4,948,626 | 8/1990 | Yasunaga et al. | 427/128 |
| 5,202,149 | 4/1993 | Ishida et al. | 427/534 |
| 5,366,764 | 11/1994 | Sunthankar | 427/248.1 |
| 5,418,059 | 5/1995 | Sugita et al. | 428/332 |

FOREIGN PATENT DOCUMENTS

| | | |
|---|---|---|
| 0468488 | 1/1992 | European Pat. Off. . |
| 0573026 | 12/1993 | European Pat. Off. . |
| 63-251925 | 10/1988 | Japan . |
| 63-251928 | 10/1988 | Japan . |
| 2236815 | 9/1990 | Japan . |
| 4328325 | 11/1992 | Japan . |
| 6111315 | 4/1994 | Japan . |

OTHER PUBLICATIONS

Patent Abstracts of Japan, vol. 018, No. 394 (P–1775). (Apr., 1994).
English Language Abstract of Japanese Patent Laid–Open Publication 63–251925 (Oct. 1988).
English Language Abstract of Japanese Patent Laid–Open Publication 63–251928 (Oct. 1988).
English Language Abstract of Japanese Patent Laid–Open Publication 4–328325 (Nov. 1992).

*Primary Examiner*—Katherine A. Bareford
*Attorney, Agent, or Firm*—Greenblum & Bernstein, P.L.C.

[57]             ABSTRACT

A thin film magnetic recording medium is manufactured with vacuum deposition or sputtering technique. One or more reflectors are provided between the substrate and an evaporation source around a path through which evaporated atoms travel onto a substrate. When a thin film is deposited on a substrate, the one or more reflectors are heated above a melting point of an evaporation material to reflect evaporated atoms arriving them. Thus, atoms reflected by the one or more reflectors also contribute to deposition of a thin film as well as evaporated atoms arriving directly from the evaporation source, and deposition efficiency is improved. Such a reflector is also used to limit a boundary or the path through which evaporated atoms travel onto a substrate. Then, a range of incident angles of evaporated atoms onto the substrate is kept the same for a long time on deposition, and characteristics of the thin film are stable.

10 Claims, 11 Drawing Sheets

CONTINUOUS FABRICATION OF THIN FILM MAGNETIC RECORDING MEDIUM WITH VACUUM DEPOSITION

BACKGROUND OF THE INVENTION

1. Field of the Invention

The present invention relates to a thin film deposition process and an apparatus therefor.

2. Description of Related Information

Recording density to be dealt with by a magnetic recorder increases year by year, and magnetic recording media excellent in short wavelength characteristics are required for higher recording density. A thin film magnetic recording medium such as a thin film magnetic tape has been developed to meet the demand. A thin film magnetic layer for a magnetic recording medium is formed on a substrate in vacuum usually with a process such as vacuum deposition, ion plating or sputtering. The magnetic layer is made of a material such as Co, Co—Ni, Co—Ni—P, Co—O, Co—Ni—O, Co—Cr, Co—Ni—Cr, Co—Cr—Ta or Co—Cr—Pt.

In the vacuum deposition process, an evaporation material placed in an evaporation source is evaporated by a heating means such as an electron beam, and evaporated atoms adhere to a substrate arranged in a position opposite to the evaporation source, to form a thin film on the substrate. A thin film is produced similarly in the ion plating process. In the sputtering process, a target is used instead of the evaporation source, but the position of a substrate relative to the target is similar to that in the vacuum deposition process.

When a thin film is formed in a conventional vacuum deposition apparatus, it is difficult to deposit the thin film uniformly all over the substrate, and recording and reproduction characteristics differ between the central and peripheral portions of the substrate. Further, evaporated atoms which travel away outside the substrate do not adhere to the substrate or are lost wastefully. Therefore, deposition efficiency, that is, a ratio of atoms adhered to the substrate to evaporated atoms, is low. In the sputtering process, a target is used instead of the evaporation source, but the deposition efficiency is low similarly.

As to thin film magnetic tapes, high production efficiency is required as well as high S/N ratio at short wavelength regions. In the production of thin film magnetic tapes, a thin film magnetic layer is formed on a substrate strip running on a cylindrical can. Incident angles of evaporated atoms are limited by using shielding plates arranged near the substrate to define an opening or to limit a deposition area on the substrate, and evaporated atoms pass through the opening onto the substrate. In order to form a magnetic layer having a high S/N ratio on a substrate running on a can, it is known better to increase incident angles of evaporated atoms onto the substrate. However, when the incident angles of evaporated atoms are increased, the running speed of the substrate has to be set low, and this decreases productivity.

The width of the substrate is usually 50 cm or larger in an apparatus for producing magnetic recording media, and an evaporation source for an electron beam is used usually as the evaporation source. In such an apparatus, it is needed to scan the electron beam widely along a width direction to melt and evaporate an evaporation material put in the evaporation source. The scan width is usually 1.5 to 2 times the width of the substrate, and a loss of evaporated atoms along the width direction is large.

It is also a problem that when a long strip of magnetic recording media is produced continuously in a vacuum deposition apparatus, evaporated atoms deposit at edge portions of the shielding plates. Thus, the opening for evaporated atoms to pass becomes narrower to change the incident angles of evaporated atoms. Thus, the magnetic characteristics of the magnetic layer are affected.

SUMMARY OF THE INVENTION

An object of the present invention is to provide a method for manufacturing a thin film magnetic recording medium at a high deposition efficiency.

Another object of the present invention is to provide a method for manufacturing a thin film having stable characteristics.

A still further object of the present invention is to provide an apparatus for manufacturing a thin film at a high deposition efficiency.

In an aspect of the invention, when a thin film is formed on a substrate in a thin film deposition apparatus wherein a substrate and a material source wherein a material to be deposited onto the substrate is placed opposite to each other in a vacuum chamber, one or more reflector members are arranged around a space through which atoms to be deposited onto the substrate travel from the material source to the substrate. On deposition, the material placed in the material source is evaporated with an electron beam or with sputtering to deposit atoms evaporated from the material to form a thin film on the substrate, while one or more reflector members reflect atoms arriving from the evaporation source by increasing a temperature of the one or more reflector members above a melting point of the material put in the material source. Then, atoms reflected by the one or more reflector members also deposit on the substrate to increase deposition efficiency. Preferably, the temperature of the one or more reflector members is increased to 1.25 times a melting point of the material or above. Preferably, the one or more reflectors are made of carbon.

In another aspect of the invention, the substrate may be a long strip running on a cylindrical can. Two shielding plates are provided between the substrate and the material source to define an opening along a rotation direction of the cylindrical can. Further, one or more reflector members are arranged around a space through which atoms to be deposited travel from the material source to the substrate. The reflector members may also be arranged near boundaries of the space along the width direction of the substrate. The one or more reflector members may be provided outside a boundary of the space through which atoms to be deposited travel from said material source onto the substrate. On the other hand, the one or more reflector members may also be provided at a position or positions which defines or define the boundary of the space directly. For example, a part of the shielding plates for limiting a deposition region on the substrate is replaced by a reflector member. On deposition, the material put in the material source is evaporated, while atoms arriving to the one or more reflectors from the evaporation source are reflected by the one or more reflector members. Then, atoms reflected by the one or more reflector embers also deposit on the substrate. When the one or more reflector members defines or define the boundary of the space directly, the angle of incidence of evaporated atoms are limited an a range which is kept the same by the one or more reflector members.

An advantage of the present invention is that a thin film magnetic recording medium of uniform characteristics can be produced at a high deposition efficiency.

Another advantage of the present invention is that a thin film magnetic recording medium having a high S/N ratio can be produced stably at a high productivity.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
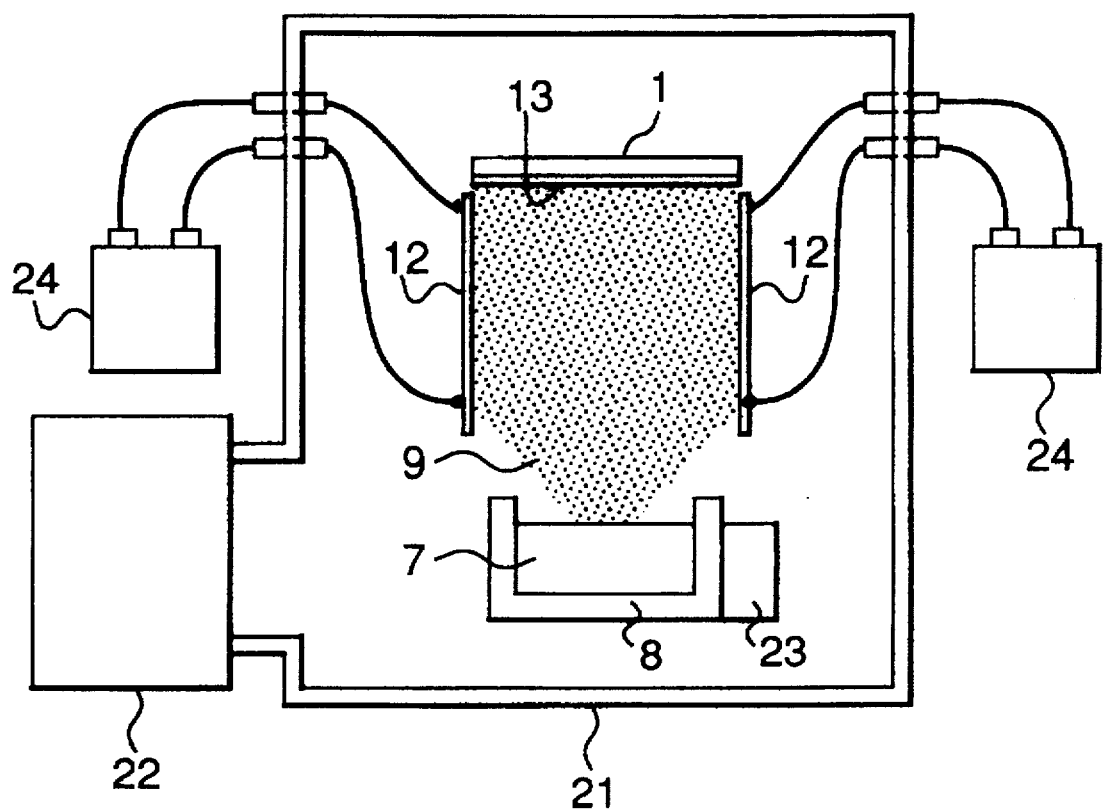
FIG. 1 is a schematic sectional view of a vacuum deposition apparatus of a first embodiment of the invention for forming a thin film of a magnetic layer in vacuum.
Figure 2:
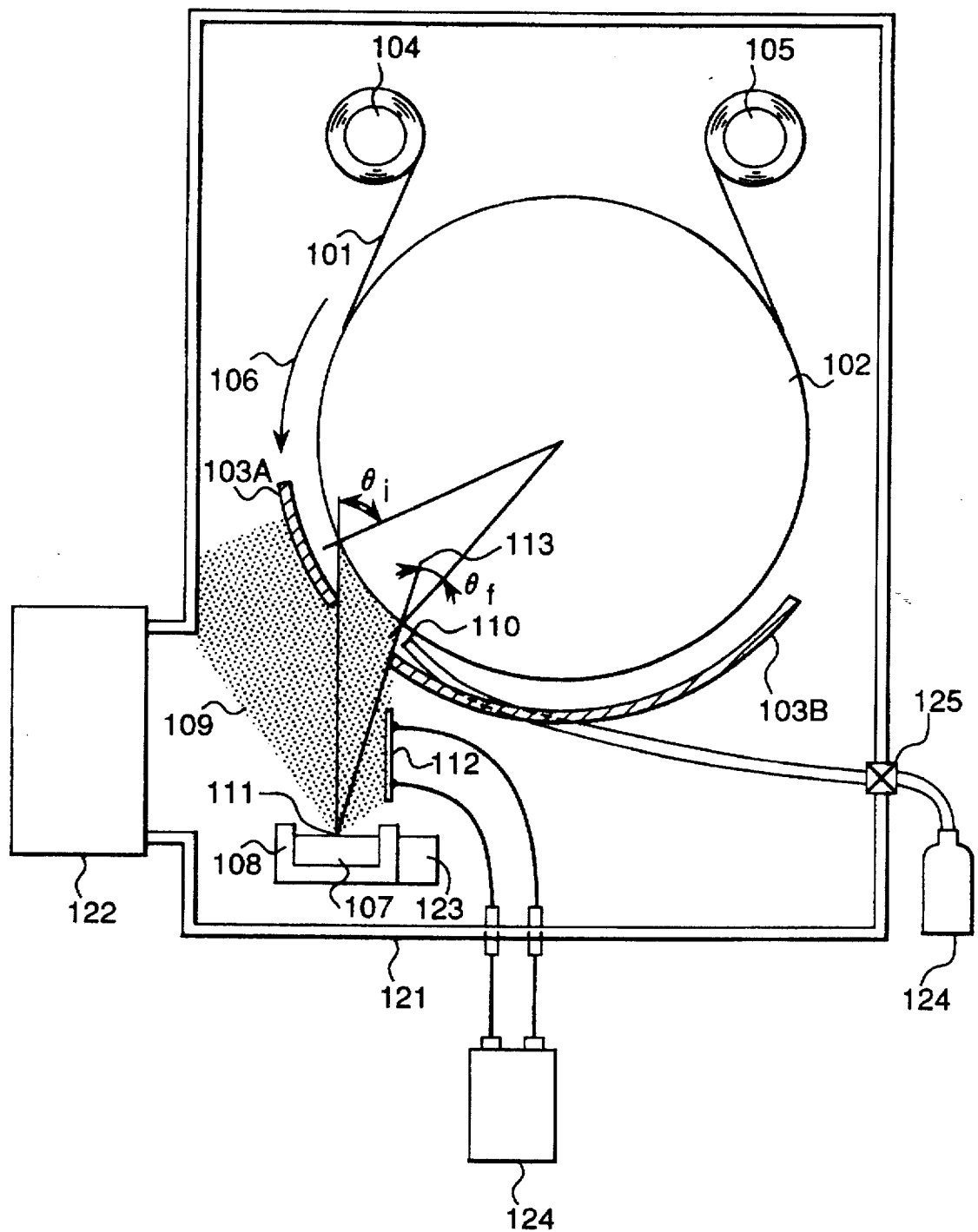
FIG. 2 is a schematic sectional view of a vacuum deposition apparatus of a second embodiment of the invention for forming a thin film of a magnetic layer in vacuum.

Referring now to the drawings, wherein like reference characters designate like or corresponding parts throughout the several views, FIG. 1 shows schematically a thin film deposition apparatus for forming a thin film in vacuum. A substrate 1 and an evaporation source 8 are provided in a vacuum chamber 21. The substrate 1 is made of glass, a plastic material, a metallic material such as aluminum or the like. The substrate 1 shown in FIG. 1 is a plate, but it can have any form such as a long tape running on a can as shown in FIG. 2. It is arranged above an evaporation source 8 wherein an evaporation material 7 such as cobalt is filled. Two reflectors 12 are arranged opposite to each other between the substrate 1 and the evaporation source 8 so as not to inhibit deposition of evaporated atoms 9 onto the substrate 1, but to inhibit for the evaporated atoms to fly outside the substrate 1. The reflectors 12 are made of tungsten, tantalum, molybdenum, carbon or the like, and it is found that carbon is most suitable among them because it is hard to react with the evaporation material and to be deformed at high temperatures.

On deposition, the vacuum chamber 21 is evacuated by a vacuum pump 22. The reflectors 12 are heated up to a temperature at which evaporated atoms do not adhere thereto, but are reflected thereby when they arrive to them on forming a thin film on the substrate 1. Then, the evaporation material 7 is heated by a heating means, and in this embodiment, it is heated by an electron beam. The electron beam is generated by an electron beam generator 23 which is shown at a side of the evaporation source 8 in FIG. 1, but the electron beam generator 23 is actually mounted to the evaporation source 8 or the vacuum chamber 21 in a position which cannot be shown in FIG. 1. Atoms 9 of the material 7 evaporated from the source 8 travel on to the substrate 1 to form a thin film 13.

The temperature of the reflectors 12 is explained further. They are heated above the melting point of the evaporation material 7. If the temperature of the reflectors 12 is a little above the melting point, a rather large advantage can be observed when deposition rate of atoms from the evaporation source 8 is low. However, when the evaporation rate is fast, a number of atoms arriving to the substrate 1 increases, so that it becomes hard for the reflectors 12 reflect the atoms arriving to them. A sufficient advantage is observed if the temperature of the reflectors 12 is 1.25 times the melting point or higher. If the evaporation material is made of cobalt having a melting point of 1,495° C., the temperature is preferably increased up to $1.25°*1,495°=1,869°$ C. or above. The higher the temperature of the reflectors 12, the less the adhesion of atoms. However, the temperature needs to be determined by taking into consideration the ease of heating and a life of the reflectors 12.

In order to increase the temperature of the reflectors 12; it is most suitable for an electrical current to flow through the reflectors 12 because the equipment therefor is simple and efficiency is high. As shown in FIG. 1, external electric power sources 24 are connected to the reflectors 12. The current supplied by the power sources 24 may be a direct current or an alternating current. Another heating means such as electron beam may be used at the same time as the above-mentioned resistor heating.

A part of the evaporated atoms 9 will be lost away outside the substrate 1 if the reflectors 12 were not provided. However, such evaporated atoms are reflected by the reflectors 12 heated above the melting point, and the reflected atoms adhere to the substrate 1 to form the film 13 as well as evaporated atoms travelling directly onto the substrate 1. Thus, deposition efficiency is improved because atoms reflected by the reflectors 12 also adhere to the substrate 1 to form a thin film 13.

Next, the production of a thin film is explained. In a first example, a thin film 13 is prepared by using the apparatus shown in FIG. 1, under following conditions: A square glass plate having a side of 15 cm is used as the substrate 1. The evaporation material 7 comprises cobalt. A distance between the substrate 1 and the evaporation source 8 is set to be 20 cm. Two plates made of graphite carbon are used as the reflectors 12, and they have height of 15 cm, width of 15 cm and thickness of 1 mm. They are set vertically, as shown in FIG. 1, around a space through which evaporated atoms travel to the substrate 1. Actually, an edge of each reflector 12 is separated by a distance of 2 cm from the substrate 1. The reflectors 12 are heated up to about 2000° C. by a current flowing therethrough. Then, the evaporation material 7 is heated by an electron beam (not shown) to deposit a film 13 on the substrate 1. On the other hand, in a first comparison example, a thin film is formed in the same conditions except that the reflectors 12 are not provided in the apparatus shown in FIG. 1.

Deposition efficiency is determined as a ratio of a mass of the cobalt thin film 13 to that of cobalt evaporated from the evaporation source 8. It is found that the deposition efficiency of the first example is 1.7 times that of the first comparison example. The thickness of the thin film 13 is measured at the center of the substrate 1 and at the two side ends thereof. It is found that a ratio of the thickness at the two side ends to that at the center is 0.95 for the thin film of the first example, while it is 0.7 in the first comparison example. Thus, it is found that the thin film 13 of the first example is superior on the deposition efficiency and the uniformness of thickness.

FIG. 2 shows schematically a vacuum deposition apparatus of a second embodiment of the invention for forming a thin film of a magnetic layer in vacuum. In a vacuum chamber 121, a substrate 101 made of a polymer material is supplied by a supply roll 104. Then, it runs along the cylindrical can 102 in a direction denoted with an arrow 106, and it is wound after deposition by a winding roll 105. An electron beam evaporation source is preferable for an evaporation source 108, and cobalt as an evaporation material 107 is filled therein. An inlet 110 is provided for introducing oxygen inside the vacuum chamber 121. Shielding plates 103A and 103B are provided to prevent for unnecessary evaporated atoms to adhere the substrate 101 or to limit an incident range of evaporated atoms 109 onto the substrate 101. Evaporated atoms passing an opening defined by the shielding plates 103A and 103B travel to the substrate 101. The shielding plate 103A determines an initial incident angle $\theta_i$ of evaporated atoms 109, while the shielding plate 103B determines a final incident angle $\theta_f$. The initial incident angle $\theta_i$ is defined as an angle of a line drawn from an evaporation point 111 to an incidence point on the substrate 101, passing near an edge of the shielding plate 103A, relative to a line from the incidence point on the substrate to the center of the can 102, while the final incident angle $\theta_f$ is defined as an angle of a line 113 drawn from the evaporation point 111 to a point on the substrate 101, passing near an edge of the shielding plate 103B, relative to a line from the point on the substrate to the center of the can 102. Though two shielding plates 103A and 103B are provided near the substrate 101 in the structure shown in FIG. 2, the plate 103A for restricting the initial incident angle $\theta_i$ is omitted when a large initial incident angle $\theta_i$ is desired on film deposition. The inlet 110 for introducing oxygen is provided at the downstream side of the substrate 101 with respect to the opening. It is a feature of the embodiment that a reflector 112 having a shape of a plate is provided between the evaporation source 108 and the shielding plate 103B at a position so as not to inhibit deposition of evaporated atoms 109 onto the substrate 101, but to inhibit for the evaporated atoms 9 to travel towards the shielding plate 103B outside the substrate 101.

On deposition, the vacuum chamber 121 is evacuated by a vacuum pump 122. The reflectors 112 are heated up to a temperature at which evaporated atoms do not adhere thereto, but are reflected thereby when they arrive to them on forming a thin film on the substrate 101. Oxygen is supplied from an oxygen cylinder 124 through the inlet 110 provided near a deposition region on the substrate under the control of a control valve 125. Then, the evaporation material 107 is heated by a heating means used in vacuum deposition, and in this embodiment, it is heated by an electron beam by an electron beam generator 123. (The position of the generator 123 is actually different from that shown in FIG. 2, similarly to the generator 23 shown in FIG. 1.) Atoms 109 evaporated from the evaporation source 108 adhere obliquely to the substrate 101 to form a magnetic layer of thin film (not shown for simplicity of illustration) on the substrate 101.

A part of the evaporated atoms 109 will be lost away outside the substrate 101 if the reflector 112 were not provided. In this embodiment, such evaporated atoms are reflected by the reflector 112, and the reflected atoms as well as evaporated atoms travelling directly onto the substrate 101 adhere to the substrate 101 to form the thin film. Thus, deposition efficiency is improved because a part of the atoms reflected by the reflector 112 adhere to the substrate 101.

Figure 3:
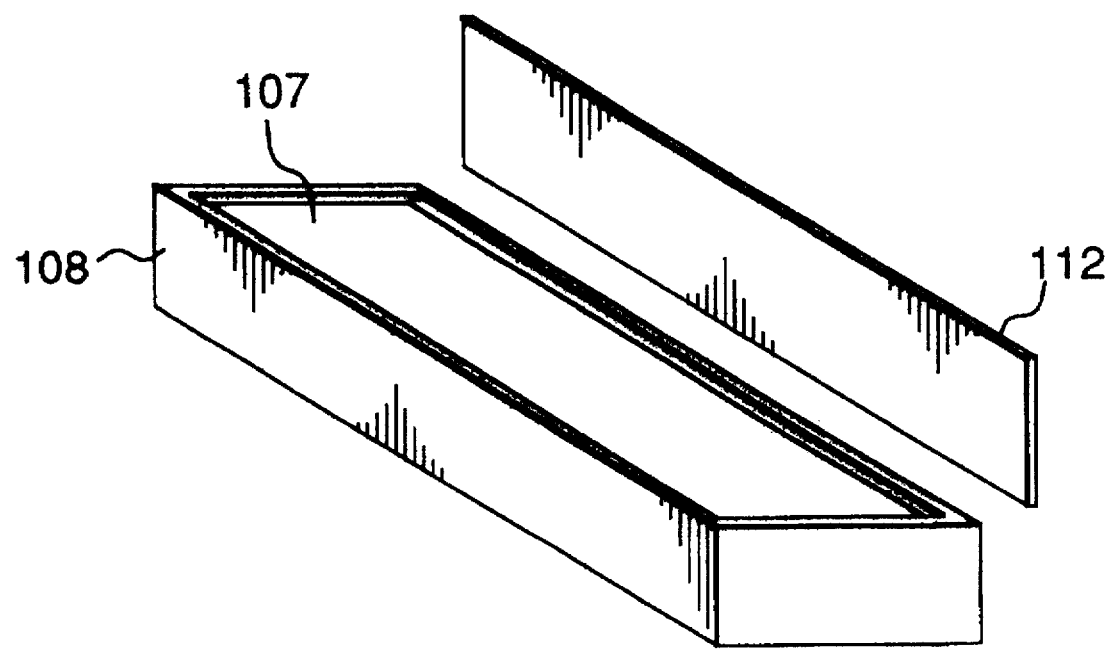
FIG. 3 is a perspective view of an evaporation source and a reflector shown in FIG. 2.

The evaporation source 108 and the reflector 112 extend along the width direction of the substrate, as shown in FIG. 3, and the width of the substrate is, for example, 50 cm or longer.

The reflector 112 is made of tungsten, tantalum, molybdenum, carbon or the like, and carbon is most suitable among them, as in the first embodiment.

In order to increase the temperature of the reflector 112, it is most suitable for an electrical current to flow through the reflector 112 because an equipment therefor is simple and efficiency is high, as in the first embodiment. The current may be a direct current or an alternating current. Further, another heating means such as electron beam heating may be used at the same time as the above-mentioned resistor heating.

The reflector 112 is heated up to a temperature at which evaporated atoms do not adhere thereto, but are reflected thereby, as in the first embodiment. In concrete, they are heated above the melting point of the evaporation material 107, or preferably at a temperature of 1.25 times the melting point or above. However, the temperature needs to be determined by taking into consideration the ease of heating and a life of the reflector 112.

The reflector 112 is arranged between the substrate 101 and the evaporation source 108 vertically at a position located at the back of the line 113 connecting an evaporated portion 111 irradiated by the electron beam and a final position of film deposition area onto the substrate 101. The "back" means that the reflector 112 is positioned outside a space through which evaporated atoms travel onto the substrate. In this position, the reflector 112 does not inhibit deposition of evaporated atoms 109 onto the substrate 101, but inhibits for evaporated atoms to travel outside the substrate 101.

Figure 4:
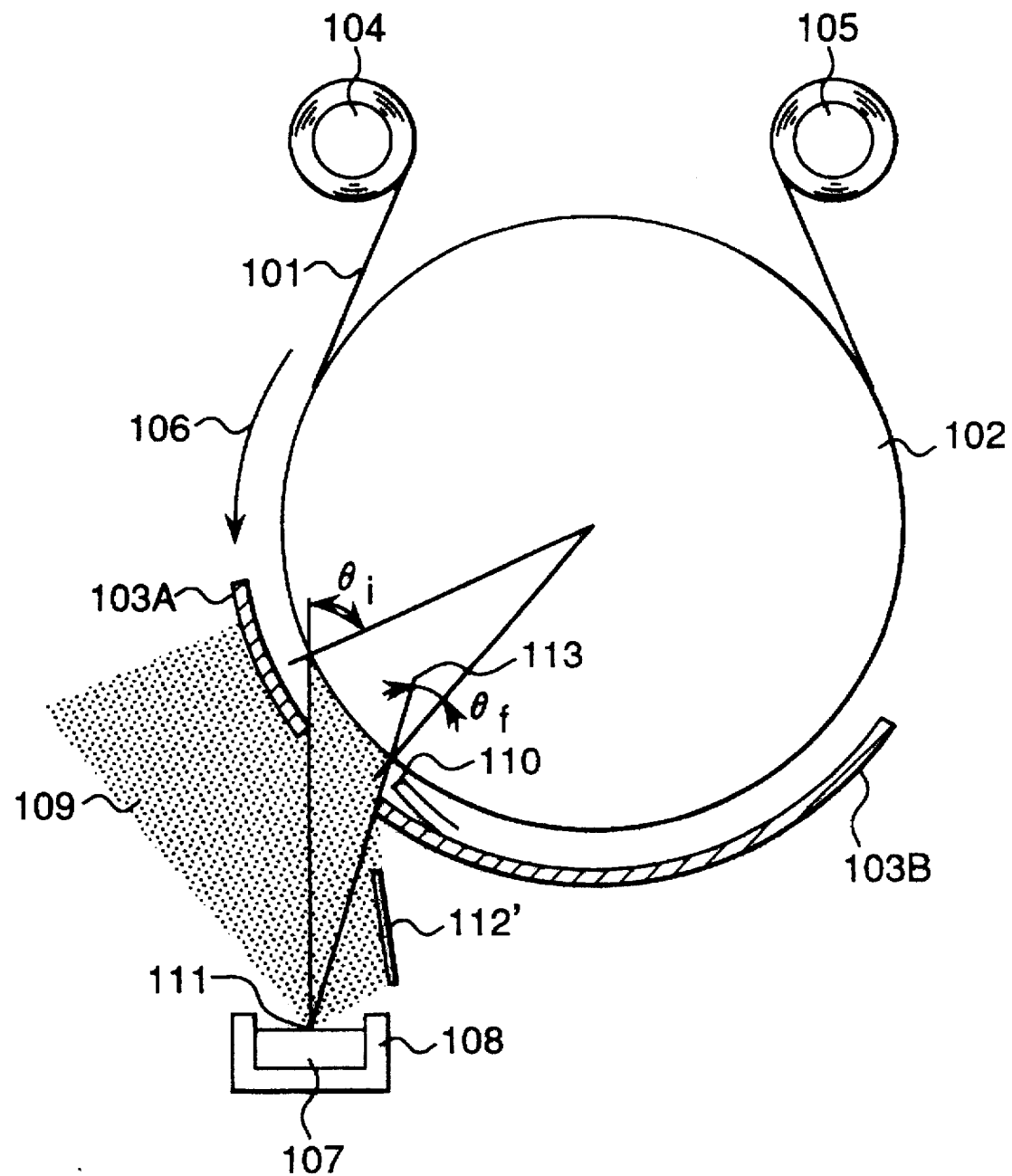
FIG. 4 is a schematic sectional view of a vacuum deposition apparatus of a modified example of the second embodiment.

FIG. 4 shows a thin film deposition apparatus inside a vacuum chamber of a modified example of the second embodiment where the reflector 112' is arranged between the substrate 101 and the evaporation source 108 at a position at the back of the line 113, similarly to the apparatus shown in FIG. 2. However, the reflector 112' is slanted a little to face the evaporation source 108. Then, the incident angle of atoms reflected by the reflector 112' is increased. It is known that if an incident angle of an atom onto the substrate 101 is increased, the recording and reproduction characteristics can be improved. In the apparatus shown in FIG. 4, the recording characteristics are improved further by providing the reflector 112' facing the evaporation material 107.

In the second embodiment, if the opening between the shielding plates 103A and 103B is kept the same as the prior art, the deposition efficiency is improved and the incident angle is increased substantially because atoms reflected by the reflector 112, 112' pass the opening to be deposited on the substrate 101. Therefore, the productivity and S/N ratio of the magnetic layer can be improved.

Next, the production of a thin film is explained. In a second example, a thin film is prepared by using the apparatus shown in FIG. 2; under following conditions: A diameter of the cylindrical can 102 is 1.5 m, and a tape of polyethylene terephthalate film of thickness of 7 μm is used as the substrate 101. A width of the substrate 101 is 50 cm.

The substrate 101 is supplied at a speed of 45 m/min on deposition. The evaporation material 107 comprises cobalt. A plate made of graphite carbon is used as the reflector 112, and it has height of 10 cm, width of 60 cm and thickness of 1 mm. The shielding plates 103A and 103B are set so that the initial incident angle $\theta_i$ and the final incident angle $\theta_f$ are 82° and 60°. The reflectors 112 are heated by an electrical current up to about 2000° C. Oxygen is introduced from the inlet 110 at a rate of 0.8 l/min. Then, the evaporation material 107 is heated by an electron beam (not shown) to deposit a magnetic layer of Co—O film of thickness of 0.1 μm on the substrate 101.

In a third example, a thin film is prepared by using the apparatus shown in FIG. 4 with the reflector 112' slanted by 20° from a vertical line. The deposition conditions are the same as those of the second example except that the above-mentioned reflector 112' is provided.

In a fourth example, a thin film is prepared by using the apparatus shown in FIG. 2 with the reflector 112. The deposition conditions are the same as those of the second example except that oxygen is introduced at a rate of 1.4 l/min and that the substrate 101 is supplied at a speed of 65 m/min on deposition.

On the other hand, in a second comparison example, a thin film is formed in the same conditions of the second example except that the reflector 112 is not provided in the apparatus shown in FIG. 2. In this case, the substrate 101 is supplied at a speed of 36 m/min on deposition, much slower than in the second to fourth examples.

The substrates with the magnetic layer formed in the second to fourth examples and the second comparison example are slitted into magnetic tapes. Then, the tapes are evaluated with a ring type magnetic head having gap length of 0.15 μm between soft magnetic layers made of Sendust alloy.

Table 1 summarizes reproduction output of the magnetic tapes of the second to fourth examples and the second comparison example. Reproduction output is measured by recording and reproducing signals of recording wavelength of 0.5 μm, and that of the second comparison example is taken as 0 dB. Further, the running speed of the substrate on forming a film of the same thickness is also shown as a relative value to the running speed of the second comparison example. Noises are about the same in the four examples.

TABLE 1 characteristics of magnetic tapes of the second embodiment

|  | Reproduction output (dB) | Running speed on forming a film of the same thickness |
|---|---|---|
| Example 2 | +2 | 1.25 |
| Example 3 | +2.5 | 1.25 |
| Example 4 | 0 | 1.8 |
| Comparison example 2 | 0 | 1 |

The data summarized in Table 1 shows that the magnetic tape produced in the second example has reproduction output higher by 2 dB than that of the second comparison example, while the running speed of the substrate is 1.25 times that of the second comparison example. Therefore, the magnetic tape of the second example is superior on both recording and reproduction characteristics and the productivity.

The data summarized in Table 1 shows that the magnetic tape produced in the third example has reproduction output higher by 0.5 dB than that of the second example. This is ascribable to the arrangement of the reflector 112' which increases the incident angle. On the other hand, the running speed of the substrate is also 1.25 times that of the second comparison example. Therefore, the magnetic tape of the third example is superior on both recording characteristic and the productivity.

The data summarized in Table 1 shows that the magnetic tape produced in the fourth example has the same reproduction output as the second comparison example, while the running speed of the substrate is 1.8 times that of the second comparison example. Therefore, the magnetic tape of the fourth example is superior on the productivity.

Figure 5:
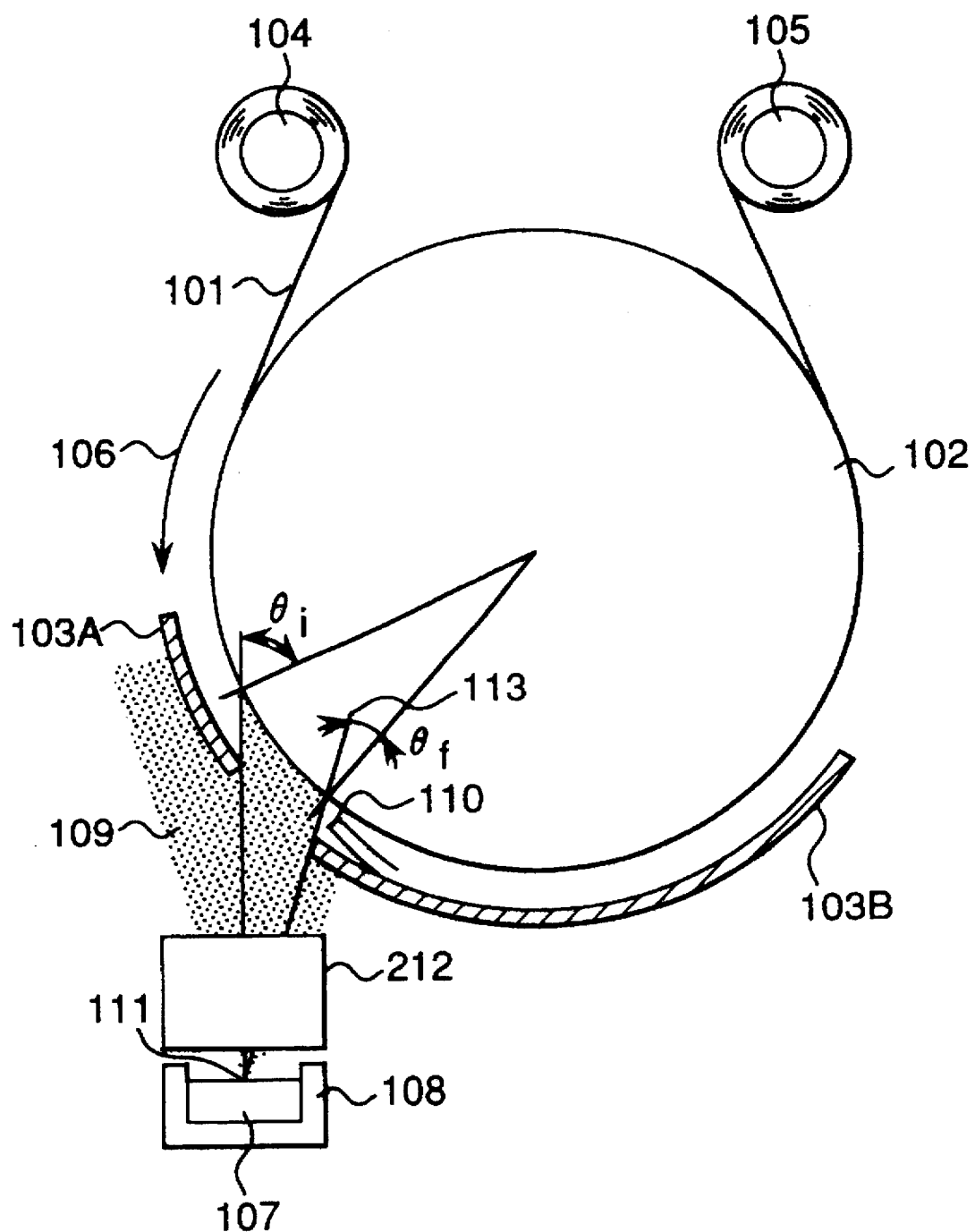
FIG. 5 is a schematic sectional view of a vacuum deposition apparatus of a third embodiment of the invention for forming a thin film of a magnetic layer in vacuum.
Figure 6:
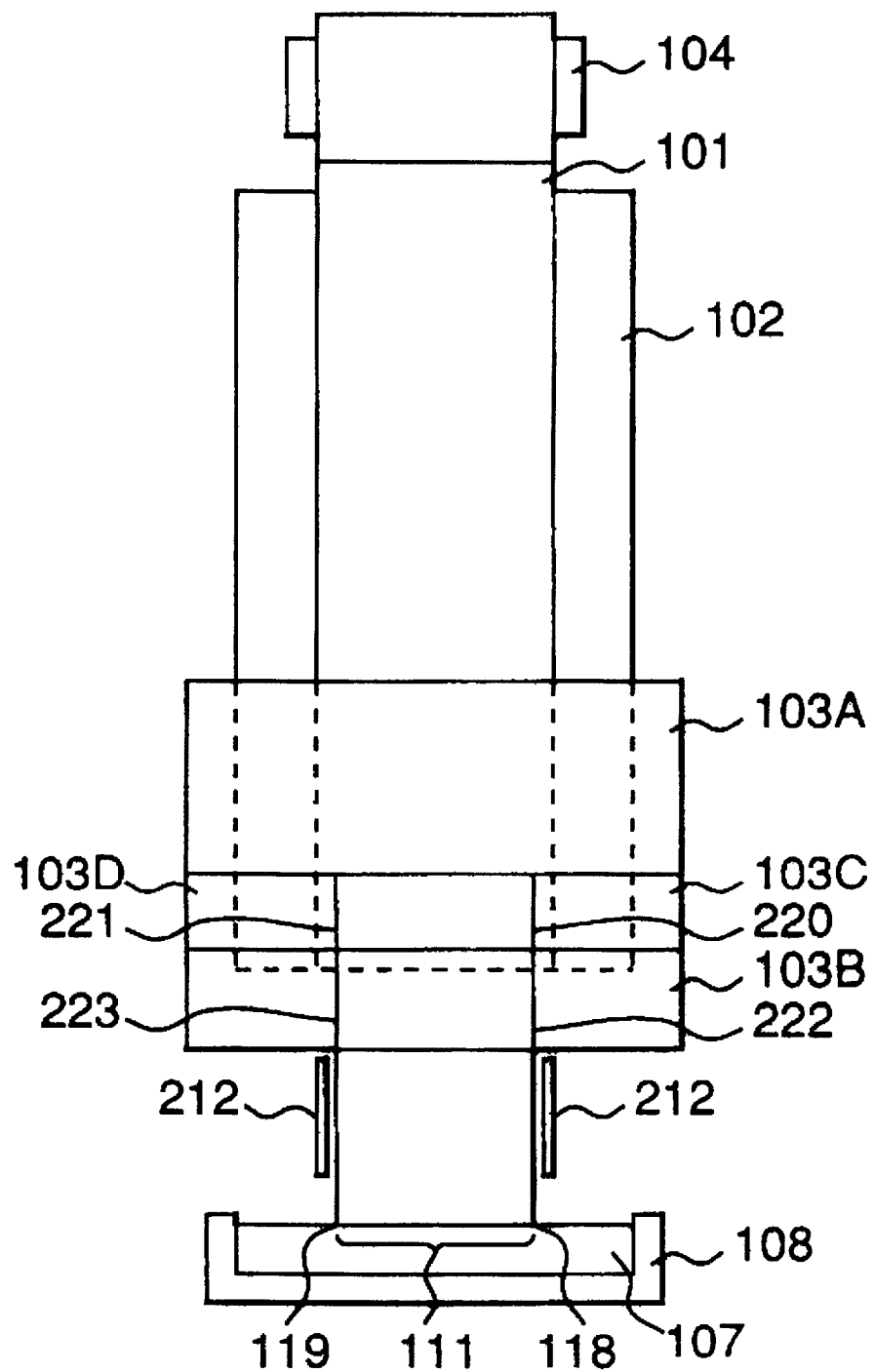
FIG. 6 is a schematic left side view of the apparatus shown in FIG. 5.

FIG. 5 shows schematically a vacuum deposition apparatus inside a vacuum chamber of a third embodiment of the invention for forming a thin film of a magnetic layer in vacuum. The apparatus is the same as that shown in FIG. 2 except that reflectors 212 of a different type are provided instead of the reflector 112. FIG. 6 is a left side view of the apparatus wherein evaporated atoms are not illustrated for simplicity. As shown in FIG. 6, two shielding plates 103C and 103D are provided at the two sides of the opening between the shielding plates 103A and 103B for limiting an evaporation region on the substrate 101 along the width direction of the substrate 101, so as to prevent deposition on two side borders of the substrate 101 and on the exposed surface of the can 102 extending from the side borders. The reflectors 212 each having a shape of a plate are provided between the evaporation source 108 and the shielding plates 103C and 103D at positions near the evaporation region so as not to inhibit deposition of evaporated atoms 109 onto the substrate 101, but to inhibit for the evaporated atoms 109 to fly towards the shielding plates 103C and 103D. The reflectors 212 are made of tungsten, tantalum, molybdenum, carbon or the like, and carbon is most suitable among them, as in the first embodiment. The reflectors 212 are heated above the melting point of the evaporation material 107, or preferably at 1.25 times the melting point or above.

A part of the evaporated atoms 109 will be lost away outside the substrate 101 along the width direction if the reflectors 212 were not provided. In this embodiment, such evaporated atoms are reflected by the reflectors 212, and the reflected atoms and evaporated atoms travelling directly onto the substrate 101 adhere to the substrate 101 to form the thin film. Thus, deposition efficiency is improved because a part of the atoms reflected by the reflectors 212 adhere to the substrate 101. If the reflectors 212 were not provided, the scan width of the electron beam has to be set as 1.5 to 2 times the width of deposition area on the substrate. However, in the embodiment, the scan width 111 can be set to be as narrow as the width of the deposition area, and the amount of the evaporation material 107 can be decreased to a large extent.

The reflectors 212 is arranged between the substrate 101 and the evaporation source 108 vertically at positions at the back of the lines 222 and 223 connecting an end point 118, 119 of the evaporated portion 111 irradiated by the electron beam and an end position 220, 221 of the film forming on the substrate 101. In these positions, the reflectors 212 do not inhibit deposition of evaporated atoms 109 onto the substrate 101, but inhibits for evaporated atoms to travel outside the substrate 101 along the width direction.

Figure 7:
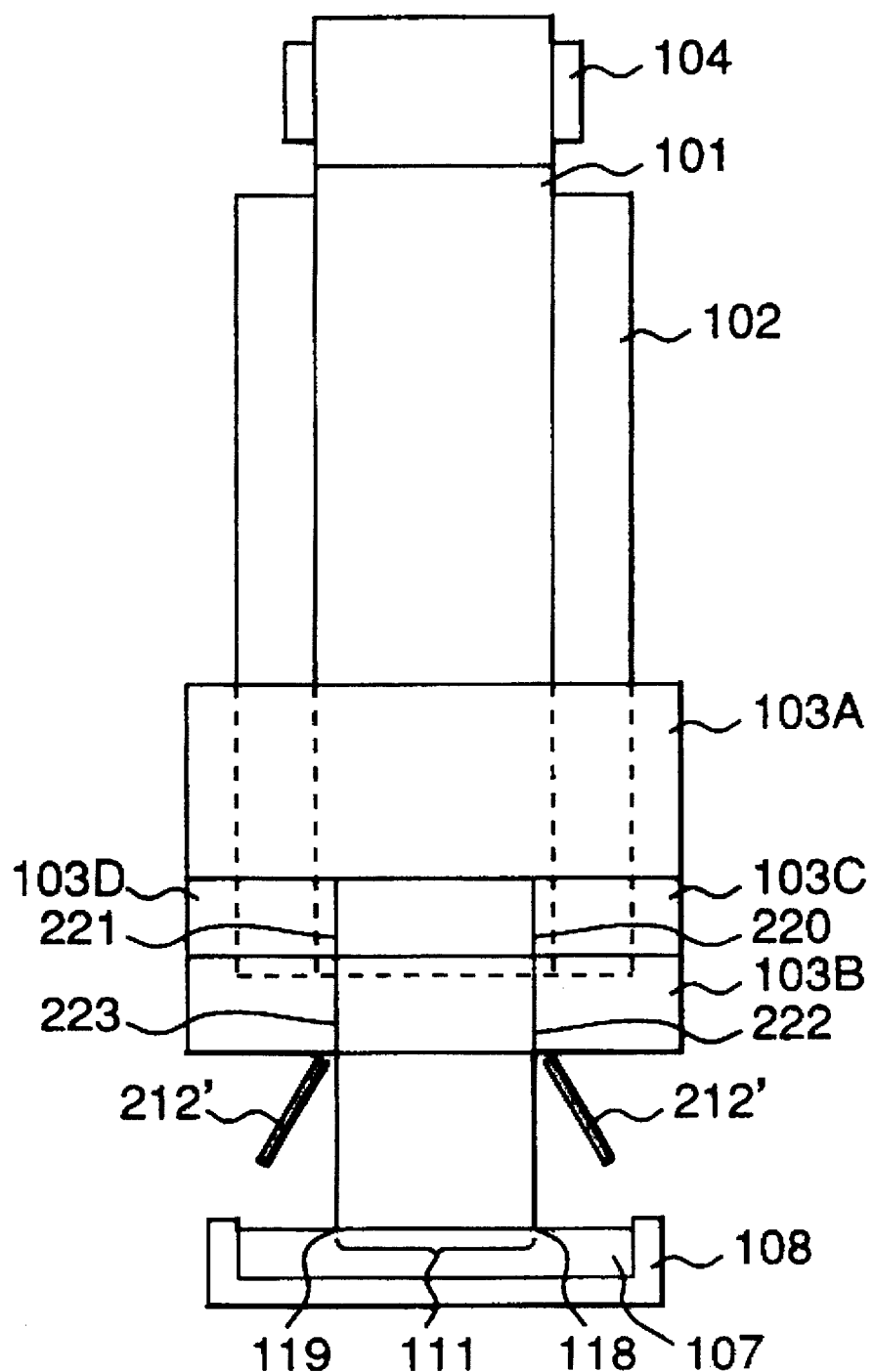
FIG. 7 is a schematic sectional view of a vacuum deposition apparatus of a modified example of the third embodiment.

FIG. 7 shows a modified example of the third embodiment where the reflectors 212' are arranged between the substrate 101 and the evaporation source 108 at positions at the back of the line 222 and 223, similarly to the apparatus shown in FIG. 6, but they are slanted a little to face the evaporation source 108. Then, the reflectors 212' can reflect more atoms by using the same area than the reflectors 212, and the productivity can be improved further.

Next, the production of a thin film is explained. In a fifth example, a thin film is prepared by using the apparatus shown in FIG. 6, under following conditions: A diameter of the cylindrical can 102 is 1.5 m, and a tape of polyethylene terephthalate film of thickness of 7 μm is used as the substrate 101. A width of the substrate 101 is 50 cm. The substrate 101 is supplied at a speed of 45 m/min on deposition. The evaporation material 107 comprises cobalt. A plate made of graphite carbon is used as the reflectors 212, and they have height of 10 cm, width of 20 cm and thickness of 1 mm. The shielding plates 103A and 103B are set so that the initial incident angle $\theta_i$ and the final incident angle $\theta_f$ are 82° and 60°. The reflectors 212 are heated by an electrical current up to about 2000° C. Oxygen is introduced from the inlet 110 at a rate of 0.8 l/min. Then, the evaporation material 107 is heated by an electron beam (not shown) to deposit a magnetic layer of thickness of 0.1 μm on the substrate 101. The deposition is continued on the substrate 101 until evaporation becomes impossible because of the decrease in the amount of cobalt in the evaporation source 108, and the length of the substrate on which the film is formed is 5,000 m.

In a sixth example, a thin film of thickness of 0.1 μm on the substrate 101 is prepared by using the apparatus shown in FIG. 7, under the same conditions as the fifth example, except that the reflectors 212' are slanted by 30°. In this example, the length of the substrate on which the film is formed is 6,000 m.

On the other hand, in a third comparison example, a thin film of thickness of 0.1 μm is prepared by using the apparatus which is the same as that shown in FIG. 6 except that the reflectors 212 are not provided and that the scan width of the electron beam along the width direction is set as 80 cm. In this example, the length of the substrate on which the film is formed is 3,000 m much shorter than those in the fifth and sixth examples. In the third comparison example, the scan width of 80 cm wider than 50 cm of the fifth and sixth examples is needed to produce a tape having uniform characteristics along the width direction. Therefore, it is confirmed that the third embodiment of the invention can produce a much longer tape than the comparison example.

Figure 8:
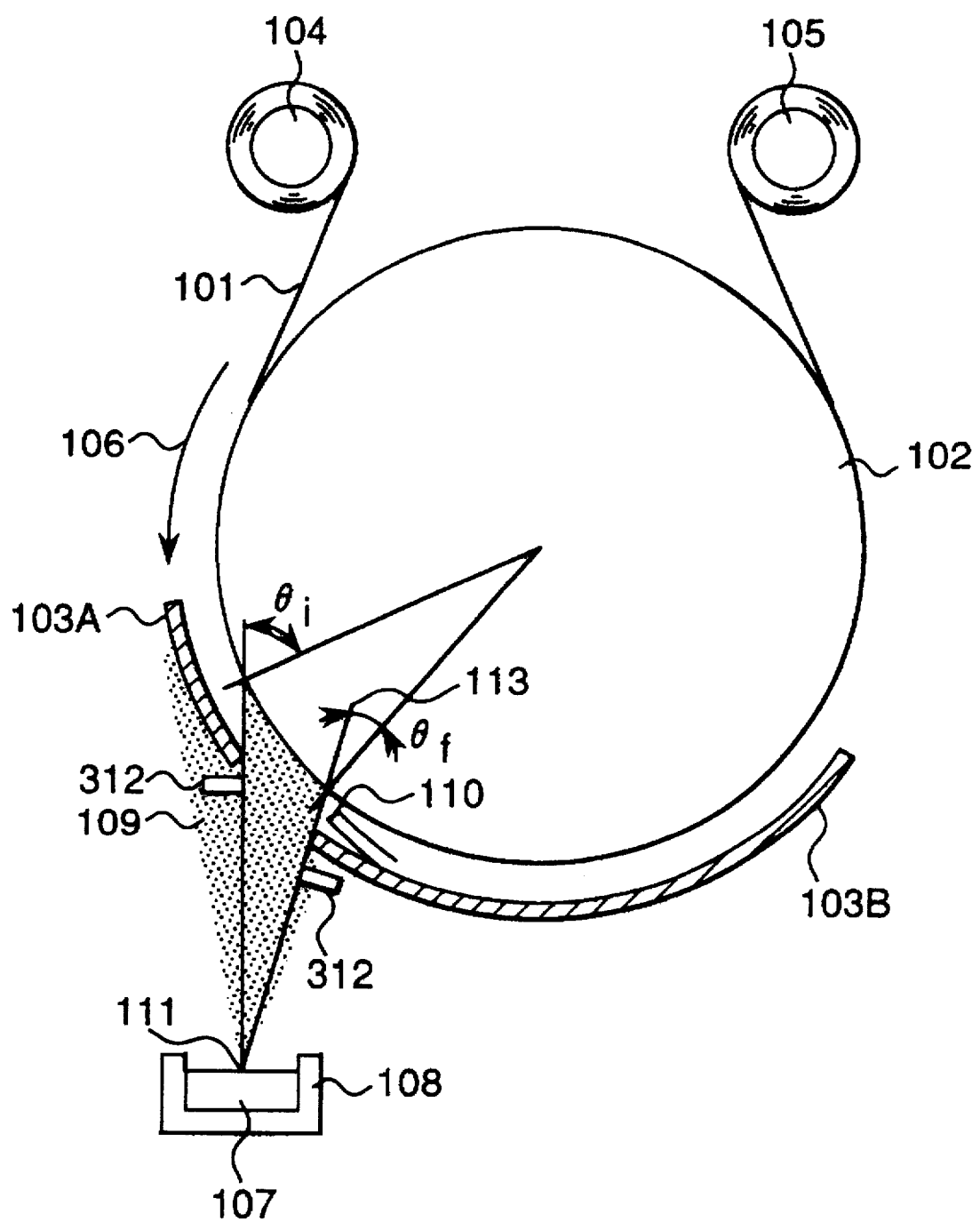
FIG. 8 is a schematic sectional view of a vacuum deposition apparatus of a fourth embodiment of the invention for forming a thin film of a magnetic layer in vacuum.

FIG. 8 shows schematically a vacuum deposition apparatus inside a vacuum chamber of a fourth embodiment of the invention for forming a thin film of a magnetic layer in vacuum, and the apparatus is the same as that shown in FIG. 2 except that of two reflectors 312 of a different type are provided near the opening between the shielding plates 103A, 103B instead of the reflector 112. Evaporated atoms 109 travelling onto the substrate 101 adhere to the substrate 101 to form a thin film (not shown). The reflectors 312 each having a shape of a plate are provided between the evaporation source 108 and the shielding plate 103A, 103B near edges of the shielding plates 103A, 103B, preferably at positions which shade completely the edges against atoms travelling from the evaporation source 108. Therefore, the reflectors 312 determine the initial incident angle $\theta_i$ and the final incident angle $\theta_f$. The reflectors 312 are heated above the melting point of the evaporation material 107. A part of the evaporated atoms 109 will deposit on the edges of the two shielding plates 103A and 103B if the reflectors 312 were not provided. In this embodiment, such evaporated atoms are reflected by the reflectors 312, or evaporated atoms do not deposit on the edges of the shielding plates 103A and 103B. Therefore, the initial incident angle $\theta_i$ and the final incident angle $\theta_f$ do not change on deposition for a long time. Then, a long magnetic tape having stable characteristics are produced.

In the apparatus shown in FIG. 8, two reflectors 312 are provided. However, even if only one of them is provided, the characteristics can be improved than a case with no reflector to shade the edge of the shielding plates 103A, 103B.

Figure 9:
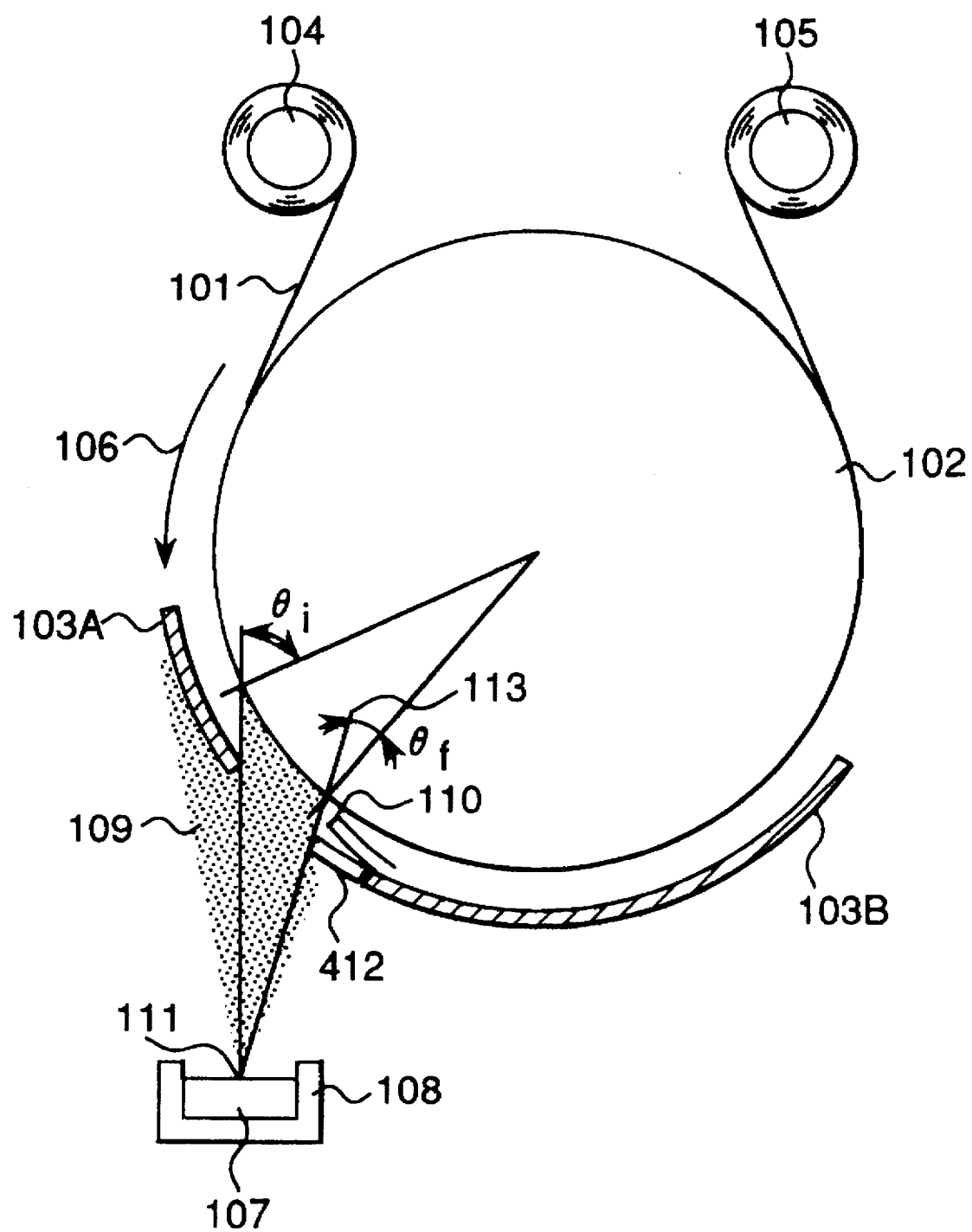
FIG. 9 is a schematic sectional view of a modified example of a vacuum deposition apparatus of the fourth embodiment.
Figure 10:
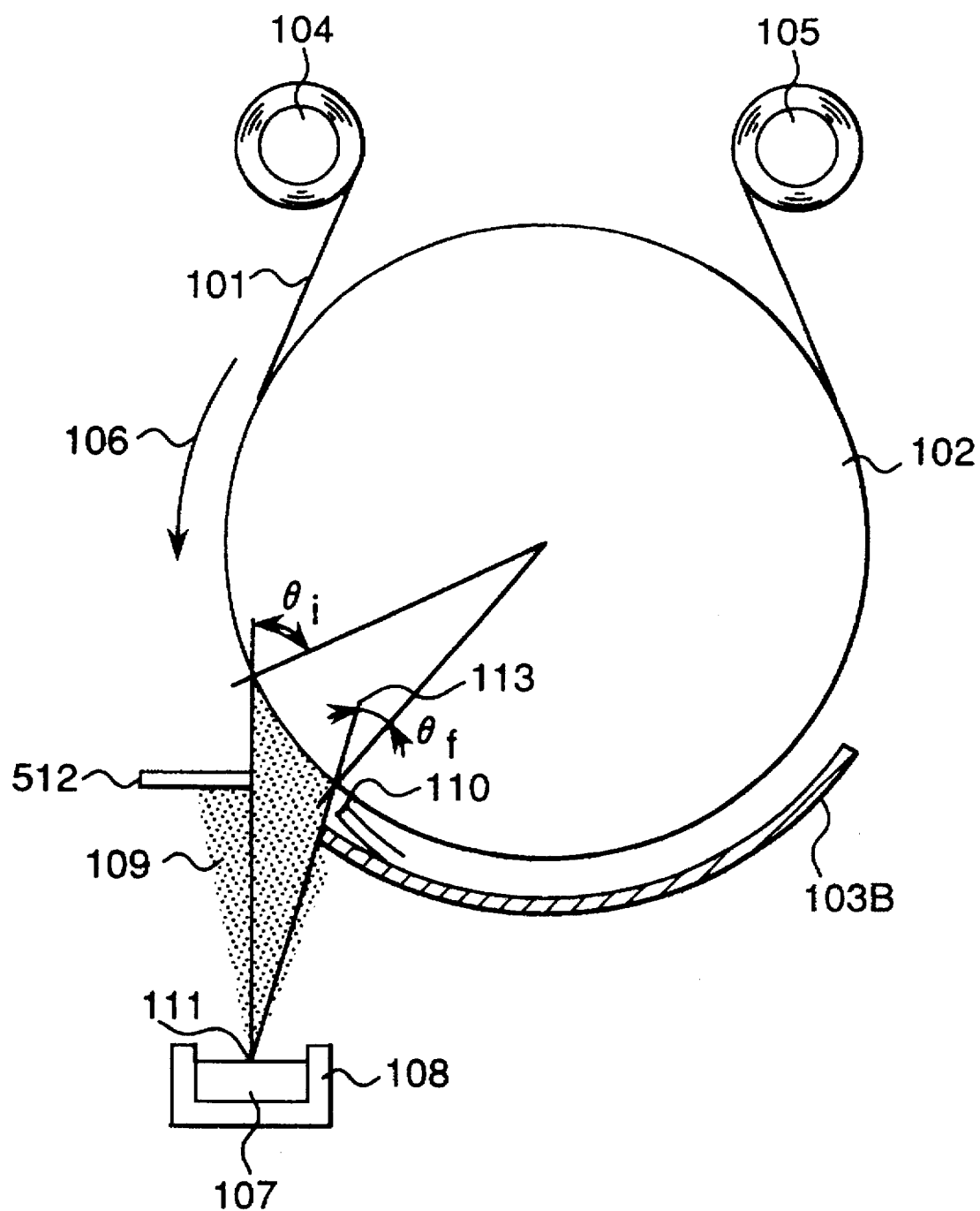
FIG. 10 is a schematic sectional view of a further modified example of a vacuum deposition apparatus of the fourth embodiment.

FIGS. 9 and 10 show apparatuses of modified examples of the fourth embodiment wherein a part of the shielding plates comprises a reflector. In the modified embodiment, a part of a shielding plate 103B provided in the downstream side is replaced by a reflector 412. Then, the reflector 412 determines the final incident angle $\theta_f$. On the other hand, in the modified embodiment shown in FIG. 10, a shielding plate provided in the upstream side is replaced by a reflector 512. Then, the reflector 512 determines the initial incident angle $\theta_i$.

Next, the production of a thin film is explained. In a seventh example, a thin film is prepared by using the apparatus shown in FIG. 8, under following conditions: A diameter of the cylindrical can 102 is 1.5 m, and a tape of polyethylene telephthalate film of thickness of 7 μm is used as the substrate 101. A width of the substrate 101 is 50 cm. The substrate 101 is supplied at a speed of 45 m/min on deposition. The evaporation material 107 comprises cobalt. Bars made of graphite carbon are used as the reflectors 312, and they have a section of 5 mm , 2 cm. The reflectors 312 and the shielding plates 103A, 103B are set so that the initial incident angle $\theta_i$ and the final incident angle $\theta_f$ are 82° and 60°. The reflectors 312 are heated by a current up to about 2000° C. Oxygen is introduced from the inlet 110 at a rate of 0.8 l/min. Then, the evaporation material 107 is heated by an electron beam (not shown) to deposit a magnetic layer of thickness of 0.1 μm on the substrate 101. Then, a magnetic layer of length of 3,000 m is produced.

On the other hand, in a fourth comparison example, a magnetic layer is produced similarly without providing the reflectors 312. Then, a magnetic layer of length of 3,000 m is produced in the same conditions as in the seventh example.

The magnetic tape produced in the seventh example has about the same magnetic characteristics and film thickness between the start portion and the end portion thereof. On the other hand, the magnetic tape produced in the fourth comparison example at the end portion has 0.9 times the coercivity and film thickness at the start position. Then, it is found that the fourth embodiment can produce a long magnetic tape having stable characteristics.

In the above-mentioned apparatuses of the second to fourth embodiments, the reflectors 112, 112', 212, 212', 312, 412 and 512 are made of tungsten, tantalum, molybdenum, carbon or the like, and carbon is most suitable among them, as in the first embodiment. The reflectors are heated above the melting point of the evaporation material 107, and preferably at 1.25 times the melting point or above. In order to increase the temperature of the reflectors, it is most suitable for an electrical current to flow through the reflectors because an equipment therefor is simple and efficiency is high, as in the first embodiment. The current may be a direct current or an alternating current. Further, another heating means such as electron beam heating may be used at the same time as the above-mentioned resistor heating.

As explained above, a current flows through the reflectors 12, 112, 112', 212, 212', 312, 412 and 512 for heating. However, when a large current flows through them, a large magnetic field is generated and this bends the electron beam for evaporation largely or a direction of the electron beam is affected. Then, it is needed to reduce or cancel the magnetic field.

Figure 11:
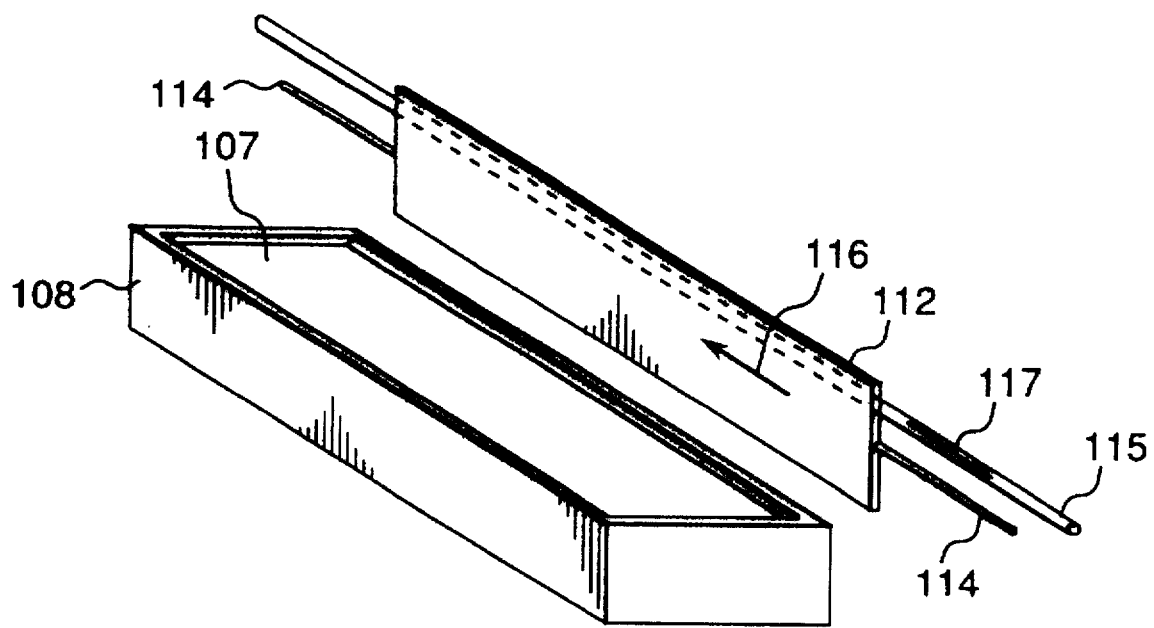
FIG. 11 is a perspective view of an evaporation source and a reflector shown in FIG. 2.

FIG. 11 shows a different example of the reflector 112 which can be heated by a current flowing through electrodes 114. Further, an electrical conduction line 115 is arranged at the back of the reflector 112 in parallel to the electrodes 114. Then, a current flows through the electrical conduction line 115 along a reverse direction 117 to the direction 116 of the current flowing through the reflector 112. Then, the magnetic field generated by the current flowing through the electrical conduction line 115 can cancel the magnetic field generated by the reflector 112. If the electrical conduction line 115 is arranged close to the reflector 112, about the same current as the current flowing through the reflector 112 flows through the electrical conduction line 115. Such electrical conduction line can also be arranged for other reflectors 12, 112', 212, 212', 312, 412 and 512.

In the first to seventh examples, cobalt is used as the evaporation material 7, 107. However, Co—Ni, Co—Fe, Co—Ni—Fe, Co—Cr, Co—Ni—Cr or the like can also be used similarly as the evaporation material. The film thickness of the magnetic layer and the initial and final incident angles are not limited to the values adopted in the examples. In the first to seventh examples, a polyethylene telephthalate film is used as the substrate. However, a polymer film such as a polyimide film, a polyamide film, a polyether imide film, a polyethylene naphthalate film, or a polymer film on which an underlayer is formed can also be used as the substrate. The thickness of the substrate is also not limited to the examples. Further, the material, shape and size of the reflectors are also not limited to the examples. The material, the shape, the size and the like of the reflectors 12, 112, the substrate 1, 101 are not limited to the above-mentioned example.

In the above-mentioned embodiments, a thin film is produced with vacuum deposition. However, it is also produced with sputtering deposition or ion plating similarly by providing the reflectors near the substrate as in the above-mentioned embodiments. A thin film deposition apparatus using sputtering deposition or ion plating is analogous to those shown in FIGS. 1–11, as is known to a person skilled in the art, and it is not illustrated with drawings. For example, in sputtering deposition, the evaporation material 7, 107 is replaced with a target material, and an electric power is provided to the target material to generate ions which sputters the target to evaporate the target material. In the ion plating, electrodes are provided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for forming a film magnetic recording medium in a film deposition apparatus comprising:

providing a running substrate;

providing a material source wherein a material placed in said material source to be deposited onto said substrate is positioned opposite said substrate in a vacuum chamber;

providing at least one shielding plate between said substrate and said material source to define an opening;

providing at least one reflector member arranged adjacent a space through which atoms to be deposited travel from said material source to said substrate;

evaporating the material placed in said material source to deposit atoms evaporated from the material to form a film on said substrate; and reflecting atoms arriving from said material source by said at least one reflector member by increasing a temperature of said at least one reflector member above a melting point of the material placed in said material source, wherein atoms reflected by said at least one reflector member also deposit on said substrate; and wherein said at least one reflector member is provided at a position so as to inhibit deposition of evaporated atoms on said at least one shielding plate, but so as not to inhibit deposition of evaporated atoms onto the substrate.

2. The method of claim 1, wherein said at least one reflecting member is positioned downstream, relative to a running direction of said substrate, of said space through which atoms to be deposited travel from said material source to said substrate.

3. The method of claim 2, wherein said space through which atoms to be deposited travel from said material to said substrate comprises a downstream boundary relative to said running direction of said substrate and said at least one reflector is arranged downstream of said boundary.

4. A method for forming a film magnetic recording medium in a film deposition apparatus comprising:

providing a running substrate, running in a direction;

providing a material source wherein a material placed in said material source to be deposited onto said substrate is positioned opposite said substrate in a vacuum chamber;

providing at least one shielding plate between said substrate and said material source to define an opening;

providing at least one reflector member arranged around a space through which atoms to be deposited travel from said material source to said substrate;

evaporating the material placed in said material source to deposit atoms evaporated from the material to form a film on said substrate; and reflecting atoms arriving from said evaporation source by said at least one reflector member by increasing a temperature of said at least one reflector member above a melting point of the material placed in said material source, wherein atoms reflected by said at least one reflector member also deposit on said substrate; and wherein said at least one reflector member is provided at a position so as to inhibit deposition of evaporated atoms beyond a width of the substrate, but so as not to inhibit deposition of evaporated atoms onto the substrate.

5. The method according to claim 4, wherein said at least one reflector member is provided at a position at an edge of said space through which atoms to be deposited travel from said material source onto said substrate.

6. The method according to claim 5, wherein said edge of said space is generally in parallel to the running direction of said substrate.

7. The method according to claim 6, wherein said at least one reflector member is generally planar and is arranged generally parallel to the running direction of said substrate.

8. The method according to claim 6, wherein said at least one reflector member is generally planar and is arranged generally non-parallel to the running direction of said substrate.

9. A method for forming a film magnetic recording medium in a film deposition apparatus comprising:

providing a running substrate;

providing a material source wherein a material placed in said material source to be deposited onto said substrate is positioned opposite said substrate in a vacuum chamber;

providing at least one shielding plate between said substrate and said material source to define an opening;

providing at least one reflector member arranged around a space through which atoms to be deposited travel from said material source to said substrate;

evaporating the material placed in said material source to deposit atoms evaporated from the material to form a film on said substrate; and reflecting atoms arriving from said evaporation source by at least one reflector member by increasing a temperature of said at least one reflector member above a melting point of the material placed in said material source, wherein atoms reflected by said at least one reflector member also deposit on said substrate;

wherein said at least one reflector member is provided at a position which defines said space through which atoms to be deposited travel from said material source onto said substrate.

10. The method of claim 9, wherein more than one reflector member is provided to define said space through which atoms to be deposited travel from said material source onto said substrate.

* * * * *

UNITED STATES PATENT AND TRADEMARK OFFICE
CERTIFICATE OF CORRECTION

PATENT NO. : 5,679,410
DATED : October 21, 1997
INVENTOR(S) : Ryuji SUGITA et al.

It is certified that error appears in the above-identified patent and that said Letters Patent is hereby corrected as shown below:

On the title page of the printed patent, paragraph [75] Inventors, lines 1-3, change "Tohma, both of Hirakata; Tatsuaki Ishida, Sakai; Kazunari Yoshimoto, Kyoto, all of Japan" to ---Tohma; Tatsuaki Ishida, all of Osaka; Kazunari Yoshimoto, Kyoto, all of Japan ---.

Signed and Sealed this

Twenty-second Day of December, 1998

Attest:

BRUCE LEHMAN

*Attesting Officer*　　　　*Commissioner of Patents and Trademarks*